United States Patent
Bohlen et al.

(10) Patent No.: US 8,718,988 B2
(45) Date of Patent: May 6, 2014

(54) METHOD FOR DETERMINING AND/OR PREDICTING THE MAXIMUM POWER CAPACITY OF A BATTERY

(75) Inventors: Oliver Bohlen, Munich (DE); Michael Roscher, Thum (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 13/446,544

(22) Filed: Apr. 13, 2012

(65) Prior Publication Data
US 2012/0215517 A1 Aug. 23, 2012

Related U.S. Application Data

(63) Continuation of application No. PCT/EP2010/065171, filed on Oct. 11, 2010.

(30) Foreign Application Priority Data

Oct. 16, 2009 (DE) .......................... 10 2009 049 589

(51) Int. Cl.
*G06F 7/48* (2006.01)
*G01R 31/36* (2006.01)
*H02J 7/00* (2006.01)
*G06F 17/10* (2006.01)

(52) U.S. Cl.
USPC .......... 703/4; 703/2; 703/3; 702/63; 320/127; 320/137

(58) Field of Classification Search
USPC .......... 320/127, 132, 148, 137; 702/63; 703/4
See application file for complete search history.

(56) References Cited

U.S. PATENT DOCUMENTS

| | | | | |
|---|---|---|---|---|
| 4,803,416 A | * | 2/1989 | Abiven et al. | 320/132 |
| 4,952,862 A | * | 8/1990 | Biagetti et al. | 320/132 |
| 5,525,890 A | * | 6/1996 | Iwatsu et al. | 320/106 |
| 5,596,260 A | * | 1/1997 | Moravec et al. | 320/135 |
| 5,635,842 A | * | 6/1997 | Yokoo et al. | 324/427 |
| 5,780,994 A | * | 7/1998 | Sisemore | 320/156 |
| 5,828,218 A | * | 10/1998 | Yokoo et al. | 324/427 |
| 5,872,453 A | * | 2/1999 | Shimoyama et al. | 324/431 |
| 6,064,180 A | * | 5/2000 | Sullivan et al. | 320/132 |
| 6,310,462 B1 | * | 10/2001 | Arai et al. | 320/132 |
| 6,326,769 B1 | * | 12/2001 | Forsberg | 320/124 |

(Continued)

FOREIGN PATENT DOCUMENTS

| DE | 102 05 120 A1 | 7/2003 |
|---|---|---|
| DE | 103 37 064 B4 | 5/2006 |
| DE | 10 2005 050 563 A1 | 4/2007 |

OTHER PUBLICATIONS

International Preliminary Report on Patentability dated May 8, 2012 (five (5) pages).

(Continued)

*Primary Examiner* — Akash Saxena
(74) *Attorney, Agent, or Firm* — Crowell & Moring LLP

(57) ABSTRACT

A method determines and/or predicts a maximum power capacity of a battery by using a model of the battery based on an electric equivalent circuit diagram that predicts the maximum power capacity of the battery. The maximum power of the battery is prognosticated for a defined prognosis period and for the different operating modes with respect to the charging or discharging operation, considering the maximum allowable operating voltage and the maximum allowable operating current.

11 Claims, 1 Drawing Sheet

(56) References Cited

U.S. PATENT DOCUMENTS

| | | | |
|---|---|---|---|
| 6,515,454 B2* | 2/2003 | Schoch | 320/132 |
| 6,531,874 B2* | 3/2003 | Mentgen et al. | 324/427 |
| 6,621,250 B1* | 9/2003 | Ohkubo et al. | 320/136 |
| 6,943,528 B2* | 9/2005 | Schoch | 320/132 |
| 7,375,495 B2* | 5/2008 | Richter et al. | 320/125 |
| 7,803,290 B2* | 9/2010 | Kosuzu et al. | 252/521.3 |
| 7,969,120 B2* | 6/2011 | Plett | 320/145 |
| 8,242,738 B2* | 8/2012 | Barsukov | 320/106 |
| 8,274,291 B2* | 9/2012 | Tsuchiya | 324/426 |
| 2002/0120906 A1* | 8/2002 | Xia et al. | 716/2 |
| 2002/0130637 A1* | 9/2002 | Schoch | 320/132 |
| 2003/0041445 A1* | 3/2003 | Jang et al. | 29/623.1 |
| 2003/0052690 A1* | 3/2003 | Schoch | 324/433 |
| 2004/0008031 A1* | 1/2004 | Arai et al. | 324/429 |
| 2004/0032264 A1* | 2/2004 | Schoch | 324/426 |
| 2006/0145702 A1* | 7/2006 | Schoch | 324/429 |
| 2006/0250137 A1* | 11/2006 | Frey et al. | 324/426 |
| 2009/0001992 A1* | 1/2009 | Tsuchiya | 324/426 |
| 2009/0048793 A1* | 2/2009 | Schoch | 702/63 |
| 2009/0256528 A1* | 10/2009 | Greening et al. | 320/162 |
| 2009/0306915 A1* | 12/2009 | Schoch | 702/63 |
| 2010/0066377 A1* | 3/2010 | Schoch et al. | 324/427 |
| 2010/0174500 A1* | 7/2010 | Plett | 702/63 |
| 2011/0031048 A1* | 2/2011 | Ohkura | 180/65.1 |
| 2012/0253777 A1* | 10/2012 | Roscher | 703/18 |

OTHER PUBLICATIONS

Oliver Bohlen, et al., "Robust Algorithms for a Reliable Battery Diagnosis—Managing Batteries in Hybrid Electric Vehicles," EVS-22, Yokohama, Japan, Oct. 23-28, 2006, The 22$^{nd}$ International Battery, Hybrid and Fuel Cell Electric Vehicle Symposium & Exposition, pp. 2010-2021.

German Search Report dated Dec. 8, 2011 with partial English translation (eleven (11) pages).

International Search Report dated Mar. 22, 2011 with English translation (four (4) pages).

* cited by examiner

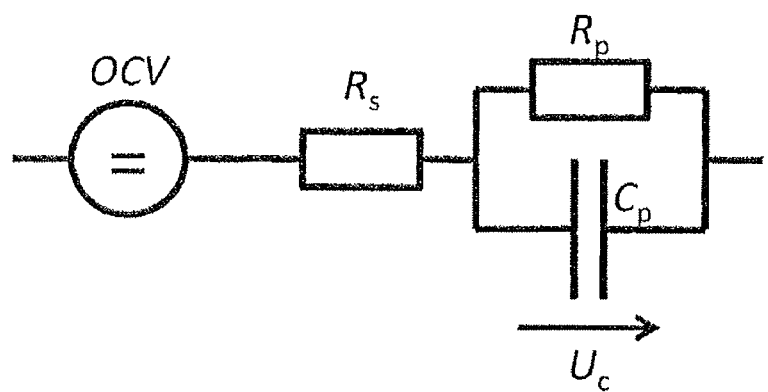

METHOD FOR DETERMINING AND/OR PREDICTING THE MAXIMUM POWER CAPACITY OF A BATTERY

CROSS REFERENCE TO RELATED APPLICATIONS

This application is a continuation of PCT International Application No. PCT/EP2010/065171, filed Oct. 11, 2010, which claims priority under 35 U.S.C. §119 from German Patent Application No. DE 10 2009 049 589.4, filed Oct. 16, 2009, the entire disclosures of which are herein expressly incorporated by reference.

BACKGROUND AND SUMMARY OF THE INVENTION

The invention relates to a method that is intended for determining and/or predicting the power capacity of a battery and that uses a model of the battery, based on an equivalent circuit diagram, that predicts the power capacity of the battery. Such a method is known from DE 1 033 7064 B4.

The aim is to use this known method to predict the high current carrying capacity of a battery, in particular, a starter battery for a motor vehicle. However, this prognosis of the starting capability does not enable the ability to make a statement about the power capacity during the rest of the operating period of the battery. However, such a statement is absolutely mandatory for operating the battery in an electric and/or hybrid vehicle. Only after the prediction of the power that can be provided by the battery in a short period of time without violating the specified voltage and current limits is it possible to use the battery in such a vehicle.

It is known from the prior art to determine the power capacity of a battery by use of characteristic maps of the voltage of the battery under load. The input parameters for these voltage characteristic maps for a specific charge or discharge power is the respective state of the battery (temperature, pulse duration, state of charge and/or open circuit voltage). See the symposium report by Bohlen, O.; Gerschler, J. B.; Sauer, D. U.; Birke, P. and Keller, M., "Robust algorithms for a reliable battery diagnosis—managing batteries in hybrid electric vehicles," EVS, Internat. Electric Vehicle Symp., 22, 2006, 2010-2021. Then, the power specifications are made available to an energy management system of, for example, a hybrid or battery powered vehicle.

An additional method that is known from the prior art consists of storing the equivalent internal resistance values of the battery for specified prognosis periods in characteristic maps or to determine the equivalent internal resistance values when the battery is operating (DE 10205120A). Then, taking into account the instantaneous open circuit voltage and an assumed load at constant current, the equivalent internal resistance values are used to calculate a voltage drop that is then compared with a specified limit.

The prior art methods do not consider the limit for the maximum charge voltage and the minimum discharge voltage that depends on the respective type of battery.

The power specifications stored in the characteristic maps do not map the dynamic behavior of batteries. As a result, the power values are either too low or too high over a specified prognosis period. In the first case the result is an overload of the battery, and in the second case the result is an unnecessary over-sizing of the battery. In addition, the number of prognosis periods is affected directly proportional to the memory space requirement, for example, during a microprocessor based calculation.

In addition, the prior art methods do not consider the internal state of the model that describes the influence of the load history of the battery at the beginning of the prognosis. Similarly the methods do not differentiate between the voltage limited and the current limited case.

The object of the present invention is to provide a method that delivers a realistic prognosis of the maximum power that can be provided by a battery.

This and other objects are achieved by a method for determining and/or predicting the maximum power capacity of a battery using a model of the battery, based on an electric equivalent circuit diagram that predicts the maximum power capacity of the battery. The maximum power of the battery is predicted for a defined prognosis period and for different operating modes with respect to the charging or discharging operation and taking into consideration the maximum allowable operating voltage and the maximum allowable operating current.

The present invention differentiates between four cases in total:
1) charging with voltage limitation,
2) charging with current limitation,
3) discharging with voltage limitation, and
4) discharging with current limitation,
where the terms "current limitation" and "voltage limitation" are defined as the consideration of the battery type dependent maximum value for the respective electric load (current or voltage).

Only after the inventive differentiation between the current limited and the voltage limited case does the battery model deliver realistic statements about the expected maximum power capacity of the battery over the entire prognosis period.

If, at the same time, the power capacity is calculated during the charging operation, taking into consideration the maximum charge current and the maximum charge voltage, then the result is usually two different values for the maximum power capacity. An advantageous further development of the invention consists of using the smaller (in terms of amount) value of the two values. As a result, none of the allowable operating limits of the battery are exceeded. The same applies to the discharging operation.

An additional improvement of the invention consists of taking into consideration the prehistory of the battery by use of an output voltage value. After a prolonged charging phase, the double layer capacitor of the battery is already polarized. Therefore, less charge power can be consumed at the same charge voltage than if the battery was previously at rest or was discharged. The same applies to the discharge case.

Other objects, advantages and novel features of the present invention will become apparent from the following detailed description of one or more preferred embodiments when considered in conjunction with the accompanying drawing.

BRIEF DESCRIPTION OF THE DRAWING

The sole FIGURE is an exemplary schematic electric equivalent circuit diagram for modeling a battery according to the present invention.

DETAILED DESCRIPTION OF THE DRAWING

The dynamic behavior—the decisive factor for the short term power capacity of batteries—is modeled and mapped by a combination of passive electric components (resistors, inductors, capacitors). Such a model is depicted in the FIGURE and is explained in detail below. The values of the model parameters are usually dependent on the temperature, the state of charge, the direction of the current (charging/discharging) and also the current intensity. These values are stored in the characteristic maps in a battery management system or can be determined by a well-known estimation method (not explained in detail) when the battery is operating.

Finally, the parameters of the battery model can be provided by a parameter estimating unit and/or obtained by a parameter characteristic map. This feature makes it possible to further improve the accuracy of the power capacity prognosis.

The prognosis of the possible maximum charge/discharge power includes, in addition to the electric model, the limit values for the currents and the maximum charge voltages and the minimum discharge voltages, respectively.

The term "minimum discharge voltage" is defined herein as the manufacturer defined voltage at the terminals of the battery, at which a discharging operation has been completed. It does not involve a time criterion, but rather a voltage criterion that defines the end of the discharging operation.

The end of the prognosis period is established at the beginning of the calculation. For example, a 10 second prognosis is always calculated, that is, the power value that can be made available for 10 seconds, calculated from the instantaneous point-in-time, without exceeding a voltage or current limit.

In this case a total of four cases have to be differentiated, as stated above:

1) charging with voltage limitation,
2) charging with current limitation,
3) discharging with voltage limitation, and
4) discharging with current limitation.

For the current limited charging (case 2), the available power increases over time; the lowest power value is the value at t=0. For all other cases (case 1, 3, 4) the available power decreases as the duration of the load increases; therefore, the lowest power value during a time interval of $t_x$ seconds is the value at $t=t_x$.

Whether a charging or discharging is limited by the voltage or current limit cannot be determined from the beginning. Therefore, the prognosis of the maximum available power is calculated for both cases. The smallest power in terms of amount is equivalent to the maximum power that is actually available. Since both the maximum allowable charge power and the maximum allowable discharge power can be calculated when the battery is working, the results are the above four cases.

The power prognosis is determined by the fact that the solution of the differential equation, which describes the battery model (see the FIGURE), is calculated explicitly for these four cases, taking into consideration the starting conditions.

The solutions of the differential equations, which describe the model of the FIGURE, are the following:

For charging or discharging at constant current (cases 2 and 4), the variation over time of the voltage response after connecting a load (charging or discharging) yields:

$$u(t) = OCV + I_{lim} \cdot R_S + I_{lim} \cdot R_p \cdot (1 - e^{-t/\tau_1}) + U_{CO} \cdot e^{-t/\tau_1}$$
$$\tau_1 = R_p C_p$$

In this case OCV describes the open circuit voltage of the battery; $I_{lim}$, the current limit (value for the constant current charging); $R_S$, the series resistor of the battery; $R_p$, the parallel resistor of the battery impedance; and $C_p$, the parallel capacitor of the battery impedance (cf. FIG. 1). $U_{CO}$ describes the biasing of the capacitor $C_p$ in the equivalent circuit diagram; this can be calculated with a real time model while the battery is running.

Such a real time model can be an electric equivalent circuit diagram, which is depicted in the FIGURE. Then, the voltage $U_C$ over the capacitor can be determined from the current profile at any time. The value of Uc at time t=0 (the time, at which the prognosis is calculated) corresponds to $U_{CO}$. The advantage over other methods, which do not consider $U_{CO}$ and, thus, implicitly assume $U_{CO}=0$, lies in the fact that a more accurate prediction is possible if this voltage is taken into consideration.

For charging or discharging with constant voltage (cases 1 and 3), the result is the current response:

$$i(t) = [(U_{lim} - OCV)/(R_S + R_p)] \cdot [1 + (R_p/R_S) \cdot e^{-t/\tau_u}] - [(U_{CO}/R_S) \cdot e^{-t/\tau_u}] \tau_u = [(R_S \cdot R_p)/(R_S + R_p)] \cdot C_p$$

where $U_{lim}$ describes the voltage limit, that is, the value for the charging with the maximum allowable constant voltage.

The respective power values that are set in comparison to each other are equal to the product of the current and the voltage—that is $P_{prog} = u(t) \cdot I_{lim}$ for the current limited cases (2 and 4), and $P_{prog} = i(t) \cdot U_{lim}$ for the voltage limited cases (1 and 3).

The model parameters $R_S$, $R_p$ and $C_p$ for the instantaneous operating state are provided by a well-known parameter estimating unit and/or a parameter map that is also customary.

The value of the open circuit voltage OCV is, as well-known, provided by a state estimating unit or from the characteristic maps. The value $U_{CO}$ of the biasing of the capacitor $C_p$ is determined by use of a model that is calculated in real time. From this value the voltage values and the current values for the current and voltage limited charging and discharging cases (cases 1 to 4) are calculated for the prognosis time $t_{prog}$ (special case charging with current limitation: calculation for $t_{prog}=0$).

As stated above, when charging at the current limit, in contrast to the three other cases, the power values increase as the load duration progresses.

This feature makes possible a continuous calculation of the maximum power explicitly with good accuracy for an infinite number of prognosis periods, because the underlying battery model explicitly considers the properties of the battery and, in particular, the starting conditions ($U_{CO}$) and the varying boundary conditions (current and voltage limitation).

The computational and storage requirement is independent of the number of prognosis periods and, thus, offers the possibility of using the power capacity of the battery in the most optimal way with a minimum of application parameters.

For the correct calculation of the power prognosis a special case has to be considered.

For charging a battery, the charge power increases continuously as the current values increase, because the voltage also increases correspondingly. However, when discharging, the voltage drops as the discharge current values increase, so that the discharge power increases at first, but then decreases again after a specific current intensity, if the voltage under load is smaller than half the open circuit voltage of the battery.

If the voltage prognosis for case 4 (see above) is smaller than half the open circuit voltage (OCV/2), then the associated power value is discarded, because it is smaller than the maximum available discharge power. Instead, only the power prognosis for case 3 is calculated, where the specified voltage limit is replaced with OCV/2, in the event that the voltage limit is below this value (that is, $U_{lim} \geq OVC/2$).

This shall be explained below by way of an exemplary embodiment.

In a battery management system (not illustrated), the variables—voltage, current and temperature—are continuously measured, and, if necessary, other battery variables, like the state of charge and the state of ageing, are determined.

At any point-in-time the voltage and current limits of the battery ($U_{lim}$, $I_{lim}$) are also determined (for example, from a table, as a constant, or as a function of the state of charge, the temperature, the degree of aging and/or the load history). In this case the limits that are used for the power prognosis can be calculated from the error limits by a factor or offset. In so doing, the limits usually lie in a narrower range (that is, lower when charging and higher when discharging), so that there is no error reaction, when the prognosticated voltage or current slightly deviates from the real values due to model or measurement inaccuracies.

The parameters $R_S$, $R_p$, $C_p$ of the battery model shown in the FIGURE are also determined continuously, for example, in that they are read out of a table as a function of at least one of: the state of charge, the temperature, the degree of aging, the load history, and the current value or in that they are determined by an estimation method or by a combination of both.

The described methods lend themselves well to calculating the prognosis values for the available battery power $P_{prog}$ for the charging and discharging operations. These prognosis values can be determined for a variety of prognosis horizons. For example, a short term prognosis (for example, a 1 second prognosis horizon) and a long term prognosis (for example, a 10 second prognosis horizon) can always be calculated.

These power prognosis values are passed to the battery strategy adjustment device (also not depicted). The battery strategy adjustment device can use these values (for example, to control the electric motor, to split the electric and mechanical power when accelerating and/or braking and/or to switch on or off the electric consumers).

In particular, the power prognosis can be used for predictive control of the power flows. Since the available power is known from the beginning, it is possible to eliminate the need for very fast and abrupt interventions in the power flow that would otherwise lead to an undesirable driving experience (for example, bucking, perceptible or audible drop in power when accelerating, etc.).

If, for example, during an accelerating operation the prognosis for the power that is available for 10 seconds is less than the short term available power, then either the power can be limited from the beginning below the short term power that is possible, in order to avoid a perceptible drop in power, or the power is steadily reduced to an extent that is imperceptible to the driver and, therefore, does not feel uncomfortable. The lower target value is reached in due time before the power limit is reached.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for predicting a maximum power capacity of a battery, the method comprising the acts of:
   using a model of the battery, which is based on an electric equivalent circuit diagram, to predict the maximum power capacity of the battery, wherein:
   the maximum power of the battery is prognosticated for a defined prognosis period and for different operating modes with respect to charging or discharging operation, the prognosticating for the defined prognosis period taking into consideration a maximum allowable operating voltage and a maximum allowable operating current,
   the operating modes comprise charging with voltage limitation, charging with current limitation, discharging with voltage limitation, and discharging with current limitation, and
   the model comprises a current response that is an exponential function of time at a fixed voltage.

2. The method according to claim 1, wherein the power capacity of the battery for the charging or discharging operation is equal to a value, in terms of amount, that is the lesser of: (a) simultaneously determined maximum power values for the maximum allowable charging or discharging current, and (b) the maximum allowable charging or discharging voltage.

3. The method according to claim 2, further comprising the act of considering a load prehistory of the battery using a calculated bias value.

4. The method according to claim 2, further comprising the act of providing parameters for the model of the battery via a parameter estimating unit.

5. The method according to claim 2, further comprising the act of obtaining parameters for the model of the battery from a stored parameter map.

6. The method according to claim 1, further comprising the act of considering a load prehistory of the battery using a calculated bias value.

7. The method according to claim 6, further comprising the act of providing parameters for the model of the battery via a parameter estimating unit.

8. The method according to claim 6, further comprising the act of obtaining parameters for the model of the battery from a stored parameter map.

9. The method according to claim 1, further comprising the act of providing parameters for the model of the battery via a parameter estimating unit.

10. The method according to claim 1, further comprising the act of obtaining parameters for the model of the battery from a stored parameter map.

11. The method according to claim 1, wherein the model further comprises a voltage response that is a function of time at a fixed current.

* * * * *